US012772632B2

(12) United States Patent
Namiki et al.

(10) Patent No.: US 12,772,632 B2
(45) Date of Patent: Oct. 20, 2026

(54) REPAIRING COMPONENT INCLUDING MICRO-LED CHIP AND PRODUCTION METHOD THEREOF, REPAIRING METHOD, METHOD FOR PRODUCING LIGHT EMITTING DEVICE, AND LIGHT EMITTING DEVICE

(71) Applicant: DEXERIALS CORPORATION, Tochigi (JP)

(72) Inventors: Hidetsugu Namiki, Tochigi (JP); Takeshi Nishio, Tochigi (JP); Yasumasa Shin, Tochigi (JP); Daiki Noda, Tochigi (JP)

(73) Assignee: DEXERIALS CORPORATION, Tochigi (JP)

( * ) Notice: Subject to any disclaimer, the term of this patent is extended or adjusted under 35 U.S.C. 154(b) by 713 days.

(21) Appl. No.: 17/905,265

(22) PCT Filed: Feb. 26, 2021

(86) PCT No.: PCT/JP2021/007435
§ 371 (c)(1),
(2) Date: Aug. 30, 2022

(87) PCT Pub. No.: WO2021/182139
PCT Pub. Date: Sep. 16, 2021

(65) Prior Publication Data

US 2023/0015183 A1 Jan. 19, 2023

(30) Foreign Application Priority Data

Mar. 10, 2020 (JP) ............................. JP2020-040639

(51) Int. Cl.
*H10H 20/857* (2025.01)
*H10H 20/01* (2025.01)
*H10W 90/00* (2026.01)

(52) U.S. Cl.
CPC .......... *H10H 20/857* (2025.01); *H10H 20/01* (2025.01); *H10W 90/00* (2026.01)

(58) Field of Classification Search
None
See application file for complete search history.

(56) References Cited

U.S. PATENT DOCUMENTS

2010/0230696 A1* 9/2010 Fukunaga ............ H10H 20/854 257/E33.056
2013/0330853 A1* 12/2013 Tischler ............... H10H 20/857 438/27

(Continued)

FOREIGN PATENT DOCUMENTS

CN 110335845 10/2019
JP H02-177547 7/1990

(Continued)

OTHER PUBLICATIONS

Office Action mailed on Sep. 3, 2024 issued with respect to the correponding Taiwan Patent Application No. 110107319.

(Continued)

*Primary Examiner* — Feifei Yeung Lopez
(74) *Attorney, Agent, or Firm* — IPUSA, PLLC

(57) ABSTRACT

A repairing component including a micro-LED chip including an electrode and having an electrode plane on which the electrode is disposed, and an anisotropic conductive layer disposed to be in contact with the electrode disposed on the electrode plane of the micro-LED chip, where the anisotropic conductive layer has an area matching with an area of the electrode plane.

6 Claims, 6 Drawing Sheets

(56) References Cited

U.S. PATENT DOCUMENTS

| | | | | |
|---|---|---|---|---|
| 2014/0264407 | A1* | 9/2014 | Tischler ............... | H10H 20/857 257/91 |
| 2017/0278734 | A1 | 9/2017 | Zou et al. | |
| 2017/0278760 | A1 | 9/2017 | Chen et al. | |
| 2018/0013096 | A1 | 1/2018 | Hamada et al. | |
| 2019/0148611 | A1 | 5/2019 | He et al. | |
| 2019/0181122 | A1 | 6/2019 | Hsu et al. | |
| 2019/0244937 | A1 | 8/2019 | Honjo et al. | |
| 2021/0066562 | A1 | 3/2021 | Hsieh et al. | |

FOREIGN PATENT DOCUMENTS

| | | |
|---|---|---|
| JP | 2003-332184 | 11/2003 |
| JP | 2005-129757 | 5/2005 |
| JP | 2007-324237 | 12/2007 |
| JP | 2014-065765 | 4/2014 |
| JP | 2017-157724 | 9/2017 |
| JP | 2018-006254 | 1/2018 |
| JP | 2018-506166 | 3/2018 |
| KR | 101890934 | 8/2018 |
| KR | 10-2019-0130081 | 11/2019 |
| WO | 2019/128118 | 7/2019 |
| WO | WO2020258644 | * 12/2020 |

OTHER PUBLICATIONS

Office Action mailed on Oct. 9, 2024 issued with respect to the corresponding Korean Patent Application No. 10-2022-7031000.

International Search Report for PCT/JP2021/007435 mailed on May 18, 2021.

Written Opinion of the International Search Authority for PCT/JP2021/007435 mailed on May 18, 2021.

* cited by examiner

REPAIRING COMPONENT INCLUDING MICRO-LED CHIP AND PRODUCTION METHOD THEREOF, REPAIRING METHOD, METHOD FOR PRODUCING LIGHT EMITTING DEVICE, AND LIGHT EMITTING DEVICE

TECHNICAL FIELD

The present invention relates to a repairing component including a micro-LED chip and a production method thereof, a repairing method, a method for producing a light emitting device, and a light emitting device.

BACKGROUND ART

A micro-LED display using microscopic micro-LED chips has been rated as a display device of the next generation. The micro-LED display uses a fine light-emitting diode (referred to as LED hereinafter) chip as an individual pixel, and is a display device in which the LED chips are placed on a surface of a display substrate with high density.

It is important to precisely and accurately align LED chips on a surface of a display substrate during production of such a micro-LED display.

For establishing electrical connection between a substrate and an element, such as an LED, an anisotropic conductive adhesive has been used (see, for example, PTL 1 to PTL 3).

CITATION LIST

Patent Literature

PTL 1: Japanese Patent Application Laid-Open (JP-A) No. 02-177547
PTL 2: Japanese Patent Application Laid-Open (JP-A) No. 2017-157724
PTL 3: Japanese Patent Application Laid-Open (JP-A) No. 2014-65765

SUMMARY OF INVENTION

Technical Problem

There is no suitable repairing method for a case where a defective micro-LED chip is found after electrically connecting a substrate and micro-LED chips with an anisotropic conductive adhesive. If the defective micro-LED chip is removed together with the anisotropic conductive layer by applying laser, for example, a single non-defective micro-LED chip cannot be electrically connected to the substrate to which the micro-LED chips are already connected, because a size of the micro-LED chip is very small. When a bonding agent (e.g., a solder paste, and an anisotropic conductive adhesive paste) is used, and a substrate and a micro-LED chip for replacement are electrically connected with the bonding agent, the bonding agent may come into contact with the adjacent micro-LED chip consequently causing a short-circuit because a gap between the micro-LED chips is narrow (e.g., about 10 μm).

The present invention aims at achieving the following object. Namely, the present invention has an object to provide a repairing component with which a defective micro-LED chip can be easily replaced, a method for producing the repairing component, a repairing method using the repairing component, a method for producing a light emitting device, and a light emitting device.

Solution to Problem

The means for solving the above-described problems are as follows.

<1> A repairing component including:

a micro-LED chip including an electrode and having an electrode plane on which the electrode is disposed; and an anisotropic conductive layer disposed to be in contact with the electrode disposed on the electrode plane of the micro-LED chip, where the anisotropic conductive layer has an area matching with an area of the electrode plane.

<2> The repairing component according to <1>, further including:

a base disposed to be in contact with a plane of the anisotropic conductive layer, the plane of the anisotropic conductive layer being at an opposite side to a plane of the anisotropic conductive layer where the micro-LED chip is disposed.

<3> The repairing component according to <2>, wherein the base is polyethylene terephthalate or glass.

<4> The repairing component according to <2> or <3>, wherein a plurality of laminates is disposed on the base in a manner that the laminates are set apart from one another, where each laminate includes the micro-LED chip and the anisotropic conductive layer.

<5> The repairing component according to <4>, wherein the base is in the form of tape.

<6> A method for producing a repairing component, the method including:

arranging a plurality of micro-LED chips on an anisotropic conductive layer to be set apart from one another, where the anisotropic conductive layer is disposed on a base; and removing a portion of the anisotropic conductive layer on a periphery of a plane of each of the micro-LED chips facing the anisotropic conductive layer.

<7> The method according to <6>, wherein the removing the portion of the anisotropic conductive layer includes applying laser to the anisotropic conductive layer to remove the portion of the anisotropic conductive layer.

<8> The method according to <6> or <7>, wherein the base is polyethylene terephthalate or glass.

<9> A repairing method including:

removing a defective micro-LED chip from a light emitting panel; and mounting a repairing component in a position of the light emitting panel from which the defective micro-LED chip is removed, wherein the light emitting panel includes a wiring board and a plurality of micro-LED chips, wherein the wiring board includes a plurality of electrodes, and the micro-LED chips each include an electrode and have an electrode plane on which the electrode is disposed, where the electrode of the wiring board and the electrode of the micro-LED chip are electrically connected, wherein the repairing component includes a micro-LED chip including an electrode and having an electrode plane on which the electrode is disposed, and an anisotropic conductive layer disposed to be in contact with the electrode disposed on the electrode plane of the micro-LED chip, where the anisotropic conductive layer has an area matching with an area of the electrode plane, and wherein the electrode of the micro-LED chip of the repairing component and the electrode of the wiring board are electrically connected through anisotropic electrical connection via the anisotropic conductive layer.

<10> A method for producing a light emitting device, the method including:

removing a defective micro-LED chip from a light emitting panel; and mounting a repairing component in a position of the light emitting panel from which the defective micro-LED chip is removed, wherein the light emitting panel includes a wiring board and a plurality of micro-LED chips, wherein the wiring board includes a plurality of electrodes, and the micro-LED chips each include an electrode and having an electrode plane on which the electrode is disposed, where the electrode of the wiring board and the electrode of the micro-LED chip are electrically connected, wherein the repairing component includes a micro-LED chip including an electrode and having an electrode plane on which the electrode is disposed, and an anisotropic conductive layer disposed to be in contact with the electrode disposed on the electrode plane of the micro-LED chip, where the anisotropic conductive layer has an area matching with an area of the electrode plane, and wherein the electrode of the micro-LED chip of the repairing component and the electrode of the wiring board are electrically connected through anisotropic electrical connection via the anisotropic conductive layer.

<11> A light emitting device including:

a light emitting panel, a light emitting panel including a wiring board, a plurality of micro-LED chips, an anisotropic conductive layer, and the repairing component according to <1>, wherein the wiring board includes a plurality of electrodes, the micro-LED chips each include an electrode and have an electrode plane on which the electrode is disposed, and the anisotropic conductive layer is configured to electrically connect the electrode of the wiring board and the electrode of the micro-LED chip through anisotropic electrical connection, and wherein the repairing component and the wiring board are electrically connected through anisotropic electrical connection via the anisotropic conductive layer of the repairing component.

Advantageous Effects of Invention

The present invention can provide a repairing component with which a defective micro-LED chip can be easily replaced, a method for producing the repairing component, a repairing method using the repairing component, a method for producing a light emitting device, and a light emitting device.

DESCRIPTION OF EMBODIMENTS (Repairing Component Including Micro-LED Chip)

The repairing component including a micro-LED chip according to the present invention includes a micro-LED chip and an anisotropic conductive layer. The repairing component may further include other members, such as a base, according to the necessity.

<Micro-LED Chip>

The micro-light emitting diode (LED) chip is a very small light emitting diode chip.

The micro-LED chip is a solid light emitting element that emits light of a certain wavelength band from a top plane of the element.

For example, the micro-LED chip has a planar shape that has sides each in the size of 5 μm or greater and 100 μm or less.

Examples of the planar shape of the micro-LED chip include a square.

The micro-LED chip is a thin piece. For example, an aspect ratio (height H/width W) of the micro-LED chip is 0.1 or greater and 1 or less.

The micro-LED chip includes an electrode and has an electrode plane on which the electrode is disposed.

Figure 1:
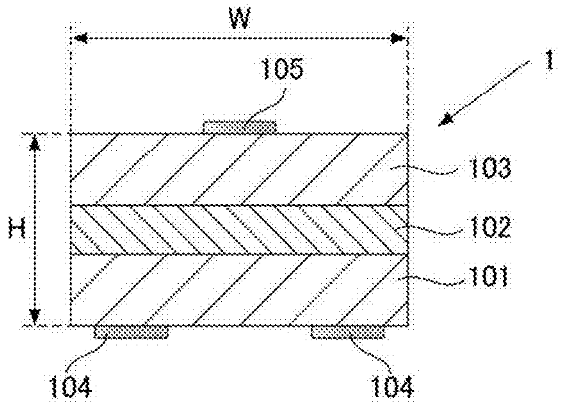
FIG. 1 is a schematic view illustrating an example of a micro-LED chip.

For example, as illustrated in FIG. 1, the micro-LED chip 1 has a laminate structure where a first conductive layer 101, an active layer 102, and a second conductive layer 103 are laminated in this order. The active layer 102 is configured to emit light of a certain wavelength band.

For a micro-LED chip capable of emitting light of a blue band or of a green band, for example, the first conductive layer 101, the active layer 102, and the second conductive layer 103 are each formed of an InGaN-based semiconductor material.

For a micro-LED chip capable of emitting light of a red band, for example, the first conductive layer 101, the active layer 102, and the second conductive layer 103 are each formed of an AlGaInP-based semiconductor material.

The first electrode 104 and the second electrode 105 are each formed of a highly reflective metal material, such as silver (Ag). Although it is not illustrated in FIG. 1, the micro-LED chip 1 may include an insulating film covering the side planes of the micro-LED chip 1 and a region of the top plane of the micro-LED chip 1 where the second electrode 105 is not formed.

Figure 2:
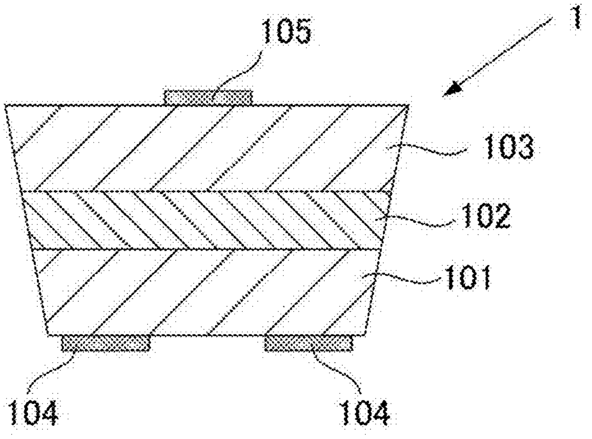
FIG. 2 is a schematic view illustrating another example of the micro-LED chip.

As illustrated in FIG. 1, for example, the side planes of the micro-LED chip 1 are each a plane orthogonal to a planar direction of each of the layers laminated. Considering light extraction efficiency, the side planes of the micro-LED chip 1 may be inclined planes each crossing the planar direction of each of the layers laminated. As illustrated in FIG. 2, for example, the micro-LED chip 1 may have, as the side planes, inclined planes to make a cross-sectional shape of the micro-LED chip 1 an inverted trapezoid.

The first electrode 104 is disposed on the bottom plane of the first conductive layer 101. The first electrode 104 is in contact with the first conductive layer 101, and is electrically connected to the first conductive layer 101.

Meanwhile, the second electrode 105 is disposed on the upper plane of the second conductive layer 103. The second electrode 105 is in contact with the second conductive layer 103, and is electrically connected to the second conductive layer 103.

A single electrode, or a plurality of electrodes may constitute each of the first electrode 104 and the second electrode 105. In FIG. 1 and FIG. 2, two electrodes constitute the first electrode 104, and a single electrode constitutes the second electrode 105.

<Anisotropic Conductive Layer>

The anisotropic conductive layer is a member configured to electrically connect between the electrode disposed on the electrode plane of the micro-LED chip and an electrode, such as an electrode of a wiring board, through anisotropic electrical connection.

In the repairing component, the anisotropic conductive layer is disposed to be in contact with the electrode disposed on the electrode plane of the micro-LED chip.

The anisotropic conductive layer in the repairing component has an area matching with the area of the electrode plane.

For example, the area of the anisotropic conductive layer is substantially identical to the area of the electrode plane. The substantially identical area of the anisotropic conductive layer means an area of the anisotropic conductive layer that hardly extends out from the electrode plane. For example, the substantially identical area is an area that is within ±10% relative to the area of the electrode plane.

For example, the anisotropic conductive layer includes at least a film forming resin, a curable resin, a curing agent, and conductive particles. The anisotropic conductive layer may further include other components according to the necessity.

<<Film Forming Resin>>

The film forming resin is not particularly limited, and may be appropriately selected in accordance with the intended purpose. Examples of the film forming resin include a phenoxy resin, an unsaturated polyester resin, a saturated polyester resin, a urethane resin, a butadiene resin, a polyimide resin, a polyamide resin, and a polyolefin resin. The above-listed film forming resins may be used alone or in combination. Among the above-listed examples, a phenoxy resin is preferably considering film forming capability, processability, and connection reliability.

Examples of the phenoxy resin include a resin synthesized from bisphenol A and epichlorohydrin.

The phenoxy resin may be appropriately synthesized for use, or may be selected from commercial products.

An amount of the film forming resin in the anisotropic conductive layer is not particularly limited, and may be appropriately selected in accordance with the intended purpose. The amount of the film forming resin is preferably 20% by mass or greater and 70% by mass or less, and more preferably 30% by mass or greater and 60% by mass or less.

<<Curable Resin>>

The curable resin (i.e., a curable component) is not particularly limited, and may be appropriately selected in accordance with the intended purpose. Examples of the curable resin include a radical polymerizable compound, and an epoxy resin.

—Radical Polymerizable Compound—

The radical polymerizable compound is not particularly limited, and may be appropriately selected in accordance with the intended purpose. Examples of the radical polymerizable compound include methyl acrylate, ethyl acrylate, isopropyl acrylate, isobutyl acrylate, epoxy acrylate, ethylene glycol diacrylate, diethylene glycol diacrylate, trimethylolpropane triacrylate, dimethyloltricyclodecane diacrylate, tetramethylene glycol tetraacrylate, 2-hydroxy-1,3-diacryloxypropane, 2,2-bis[4-(acryloxymethoxy)phenyl]propane, 2,2-bis[4-(acryloxyethoxy)phenyl]propane, dicyclopentenyl acrylate, tricyclodecanyl acrylate, tris(acryloxyethyl)isocyanurate, and urethane acrylate. The above-listed examples may be used alone or in combination.

Moreover, examples of the radical polymerizable compound also include methacrylates where the above-listed acrylates are replaced with methacrylates. The above-listed examples may be used alone or in combination.

—Epoxy Resin—

The epoxy resin is not particularly limited, and may be appropriately selected in accordance with the intended purpose. Examples of the epoxy resin include a bisphenol A epoxy resin, a bisphenol F epoxy resin, a novolak epoxy resin, modified epoxy resins of the foregoing epoxy resins, and an alicyclic epoxy resin. The above-listed examples may be used alone or in combination.

An amount of the curable resin in the anisotropic conductive layer is not particularly limited, and may be appropriately selected in accordance with the intended purpose.

The amount of the curable resin is preferably 20% by mass or greater and 70% by mass or less, and more preferably 30% by mass or greater and 60% by mass or less.

<<Curing Agent>>

The curing agent is not particularly limited, provided that the curing agent is capable of curing the curable resin with heat. The curing agent may be appropriately selected in accordance with the intended purpose. Examples of the curing agent include a thermoradical-based curing agent, a thermocation-based curing agent.

—Radical-Based Curing Agent—

The radical-based curing agent is not particularly limited, and may be appropriately selected in accordance with the intended purpose. Examples of the radical-based curing agent include organic peroxides.

Examples of the organic peroxides include lauroyl peroxide, butyl peroxide, dilauroyl peroxide, dibutyl peroxide, peroxydicarbonate, and benzoyl peroxide.

The radical-based curing agent is preferably used in combination with a radical polymerizable compound that is used as the curable resin.

—Cation-Based Curing Agent—

The cation-based curing agent is not particularly limited, and may be appropriately selected in accordance with the intended purpose. Examples of the cation-based curing agent include sulfonium salts, and onium salts. Among the above-listed examples, aromatic sulfonium salts are preferable.

The cation-based curing agent is preferably used in combination with an epoxy resin that is used as the curable resin.

An amount of the curing agent in the anisotropic conductive layer is not particularly limited, and may be appropriately selected in accordance with the intended purpose. The amount of the curing agent is preferably 1% by mass or greater and 10% by mass or less, and more preferably 3% by mass or greater and 7% by mass or less.

<<Conductive Particles>>

The conductive particles are not particularly limited, and may be appropriately selected in accordance with the intended purpose. Examples of the conductive particles include metal particles, and metal-coated resin particles.

The metal particles are not particularly limited, and may be appropriately selected in accordance with the intended purpose. Examples of the metal particles include nickel particles, cobalt particles, silver particles, copper particles, gold particles, palladium particles, and solder particles. The above-listed examples may be used alone or in combination.

Among the above-listed examples, nickel particles, silver particles, and copper particles are preferable. The above-listed metal particles may further include gold or palladium for preventing oxidization. Moreover, metal protrusions or an organic insulating film may be disposed on a surface of each particle.

The metal-coated resin particles are not particularly limited, provided that the metal-coated resin particles are particles each formed by coating a surface of a resin particle with a metal. The metal-coated resin particles may be appropriately selected in accordance with the intended purpose. Examples of the metal-coated resin particles include particles obtained by coating surfaces of resin particles with at least one metal selected from the group consisting of nickel, silver, solder, copper, gold, and palladium. Moreover, the metal-coated resin particles having metal protrusions or an organic insulating film disposed on surfaces thereof may be used. For connection considering low resistance, preferred are particles obtained by coating surfaces of resin particles with gold.

A method for coating the resin particles with a metal is not particularly limited, and may be appropriately selected in accordance with the intended purpose. Examples of the method include electroless plating, and sputtering.

A material of the resin particles is not particularly limited, and may be appropriately selected in accordance with the intended purpose. Examples of the material include a styrene-divinyl benzene copolymer, a benzoguanamine resin, a crosslinked polystyrene resin, an acrylic resin, and a styrene-silica composite resin.

The conductive particles are not limited, provided that the conductive particles have conductivity when electrical connection is to be established through anisotropic electrical connection. For example, particles each obtained by coating a surface of a metal particle with an insulating film are regarded as the conductive particles, if the particles are deformed to expose the metal particles to establish electrical connection through anisotropic electrical connection.

The average particle diameter of the conductive particles is not particularly limited, and may be appropriately selected in accordance with the intended purpose. The average particle diameter of the conductive particles is preferably 1 μm or greater and 50 μm or less, more preferably 2 μm or greater and 30 μm or less, and particularly preferably 3 μm or greater and 15 μm or less.

The average particle diameter is an average value of particle diameters obtained by measuring 10 randomly-selected conductive particles.

For example, the particle diameters can be measured by observing under a scanning electron microscope.

An amount of the conductive particles in the anisotropic conductive layer is not particularly limited, and may be appropriately selected in accordance with the intended purpose. The amount of the conductive particles is preferably 0.5% by mass or greater and 10% by mass or less, and more preferably 3% by mass or greater and 8% by mass or less.

<<Other Components>>

The above-mentioned other components are not particularly limited, and may be appropriately selected in accordance with the intended purpose. Examples of the above-mentioned other components include a silane coupling agent.

—Silane Coupling Agent—

The silane coupling agent is not particularly limited, and may be appropriately selected in accordance with the intended purpose. Examples of the silane coupling agent include an epoxy-based silane coupling agent, an acryl-based silane coupling agent, a thiol-based silane coupling agent, and an amine-based silane coupling agent.

An amount of the silane coupling agent is not particularly limited, and may be appropriately selected in accordance with the intended purpose.

The average thickness of the anisotropic conductive layer is not particularly limited, and may be appropriately selected in accordance with the intended purpose. The average thickness of the anisotropic conductive layer is preferably 1 μm or greater and 50 μm or less, more preferably 3 μm or greater and 30 μm or less, and particularly preferably 5 μm or greater and 20 μm or less.

In the present specification, the average thickness is an arithmetic mean of values of the thicknesses obtained by measuring at 10 randomly-selected points.

<Base>

The base is disposed to be in contact with a plane of the anisotropic conductive layer at an opposite side to a plane of the anisotropic conductive layer where the micro-LED chip is disposed.

The base is not particularly limited, and may be appropriately selected in accordance with the intended purpose. Examples of the base include polyethylene terephthalate, and glass.

A mold release treatment may be performed on the base. For example, the base is in the form of tape.

When the base is polyethylene terephthalate, the average thickness of the base is not particularly limited, and may be appropriately selected in accordance with the intended purpose. The average thickness of the base that is polyethylene terephthalate may be 10 μm or greater and 100 μm or less, or 20 μm or greater and 80 μm or less.

When the base is glass, the average thickness of the base is not particularly limited, and may be appropriately selected in accordance with the intended purpose. The average thickness of the base that is glass may be 0.05 mm or greater and 10 mm or less, or 0.2 mm or greater and 8 mm or less.

For example, the repairing component may have a configuration where a plurality of laminates, each including the anisotropic conductive layer and the micro-LED chip, is disposed on the base to be set apart from one another.

In this configuration, the base may be in the form of tape, and the laminates may be aligned into a single line or a few lines along a longitudinal direction of the base.

An example of the repairing component will be described with reference to drawings hereinafter.

Figure 3:
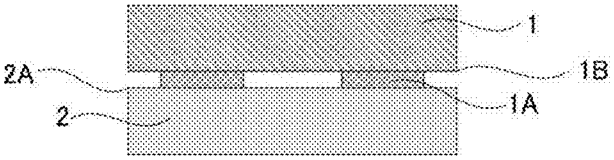
FIG. 3 is a schematic cross-sectional view illustrating an example of a repairing component.

FIG. 3 is a schematic cross-sectional view illustrating an example of the repairing component of the present invention.

The repairing component of FIG. 3 includes a micro-LED chip 1 and an anisotropic conductive layer 2. The micro-LED chip 1 includes electrodes 1A and has an electrode plane 1B on which the electrodes 1A are disposed. The anisotropic conductive layer 2 is in contact with the electrodes 1A disposed on the electrode plane 1B of the micro-LED chip 1. The area of the anisotropic conductive layer 2 corresponds to the area of the electrode plane 1B.

In FIG. 3, the electrode plane 1B and the plane 2A of the anisotropic conductive layer 2 at the side of the electrode plane 1B have the identical shapes and the identical areas. The shapes and areas of the electrode plane 1B and the plane 2A are not necessarily the same, and the shapes and areas may be slightly different from each other.

Figure 4:
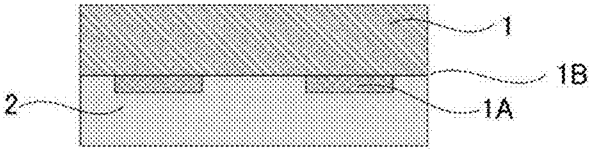
FIG. 4 is a schematic cross-sectional view illustrating another example of the repairing component.

The electrode plane 1B and the anisotropic conductive layer 2 are not in contact with each other in the repairing chip of FIG. 3. As illustrated in FIG. 4, however, the electrode 1A may be imbedded in the anisotropic conductive layer 2 to bring the anisotropic conductive layer 2 into contact with the electrode plane 1B in the repairing chip.

Figure 5A:
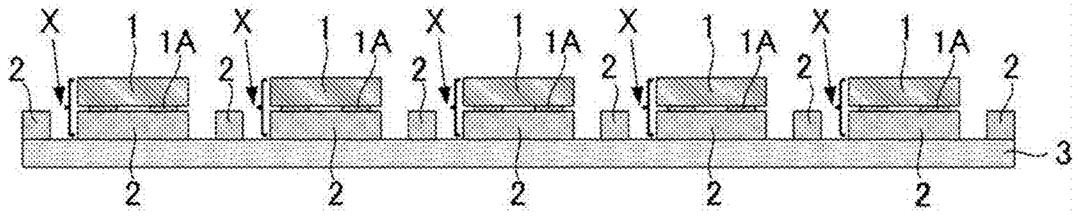
FIG. 5A is a schematic cross-sectional view illustrating another example of the repairing component.
Figure 5B:
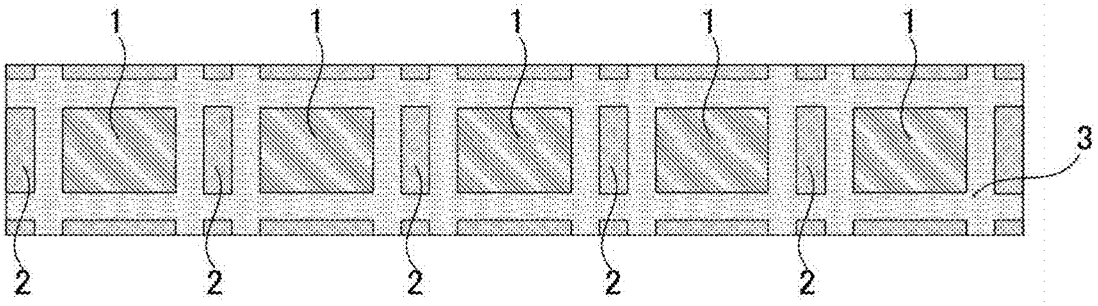
FIG. 5B is a schematic top view illustrating another example of the repairing component.

FIGS. 5A and 5B are schematic views illustrating another example of the repairing component of the present disclosure.

FIG. 5A is a schematic cross-sectional view. FIG. 5B is a schematic top view.

In the repairing component illustrated in FIGS. 5A and 5B, a plurality of laminates X is aligned into a line on the base 3, which is in the form of tape, to be set apart from one another.

The laminate X includes a micro-LED chip 1 and an anisotropic conductive layer 2 disposed to be in contact with an electrode 1A disposed on an electrode plane 1B of the micro-LED chip 1. The anisotropic conductive layer 2 has an area matching with an area of the electrode plane 1B.

The repairing component illustrated in FIGS. 5A and 5B has portions of the anisotropic conductive layer 2 on which micro-LED chips 1 are disposed, respectively, and portions of the anisotropic conductive layer each without a micro-LED chip 1 disposed between two laminates X, and the edges of the base 3. The arrangement of the portions of the anisotropic conductive layer 2 is owing to an embodiment of the below-described method for producing a repairing component. The repairing component of the present invention may have, or may not have the above-described anisotropic conductive layer 2 on which a micro-LED chip 1 is not disposed.

Since the area of the anisotropic conductive layer 2 of the laminate X is identical to the area of the electrode plane of the micro-LED chip 1 in the repairing component illustrated in FIGS. 5A and 5B, the laminate X is easily peeled off from the base 3.

(Method for Producing Repairing Component)

The method for producing a repairing component according to the present invention includes an arranging step, and a removing step, and may further include other steps according to the necessity.

<Arranging Step>

The arranging step is not particularly limited, provided that the arranging step is a step including arranging a plurality of micro-LED chips on an anisotropic conductive layer to be set apart from one another. The anisotropic conductive layer is disposed on a base. The arranging step may be appropriately selected in accordance with the intended purpose.

<<Base>>

Examples of the base include the base described in association with the repairing component of the present invention.

<<Anisotropic Conductive Layer>>

Examples of the anisotropic conductive layer include the anisotropic conductive layer described in association with the repairing component of the present invention. However, an area of the anisotropic conductive layer does not correspond to the area of the electrode plane in the arranging step.

<<Micro-LED Chip>>

Examples of the micro-LED chip include the micro-LED chip described in association with the repairing component of the present invention.

A method for arranging the micro-LED chips on the anisotropic conductive layer to be set apart from one another is not particularly limited, and may be appropriately selected in accordance with the intended purpose. Examples of the method include a method where micro-LED chips are arranged on the anisotropic conductive layer to be set apart from one another using a member capable of holding the micro-LED chips to keep the micro-LED chips apart from one another.

<Removing Step>

The removing step is not particularly limited, provided that the removing step is a step including removing a portion of the anisotropic conductive layer on the periphery of the plane of the micro-LED chip facing the anisotropic conductive layer. The removing step may be appropriately selected in accordance with the intended purpose. The removing step is preferably performed by laser irradiation.

A wavelength of laser is not particularly limited, and may be appropriately selected in accordance with the intended purpose. The wavelength is preferably 266 nm because a resin can be easily removed by laser ablation with laser having the above-mentioned wavelength.

The laser energy intensity used for the laser irradiation is not particularly limited, and may be appropriately selected in accordance with the intended purpose. The laser energy intensity is preferably 5% or greater and 100% or less, and more preferably 5% or greater and 50% or less.

The laser energy intensity is the intensity represented by a percentage of output when laser irradiation intensity 10,000 mJ/cm$^2$ is determined as 100%. For example, 10% laser energy intensity means that laser irradiation intensity is 1,000 mJ/cm$^2$.

Moreover, the number of laser shots for laser irradiation is not particularly limited, and may be appropriately selected in accordance with the intended purpose. The number is preferably 1 to 10.

A total laser irradiation intensity of the laser irradiation performed is preferably 500 mJ/cm$^2$ or greater and 10,000 mJ/cm$^2$ or less, and more preferably 1,000 mJ/cm$^2$ or greater and 5,000 mJ/cm$^2$ or less.

The total laser irradiation intensity is irradiation intensity calculated as a total value of the laser irradiation intensity from n shots of laser irradiation. The "n" is the number of the laser shots for the laser irradiation.

As a laser irradiation device for removing the anisotropic conductive layer, a device capable of performing pulsed-laser ablation, such as LMT-200 (available from Toray Engineering Co., Ltd.), C.MSL-LLO1.001 (available from TAKANO Co., Ltd.), and DFL7560L (available from DISCO Corporation), may be used.

An example of the method for producing a repairing component will be described with reference to FIGS. 6A to 6G hereinafter.

Figure 6A:
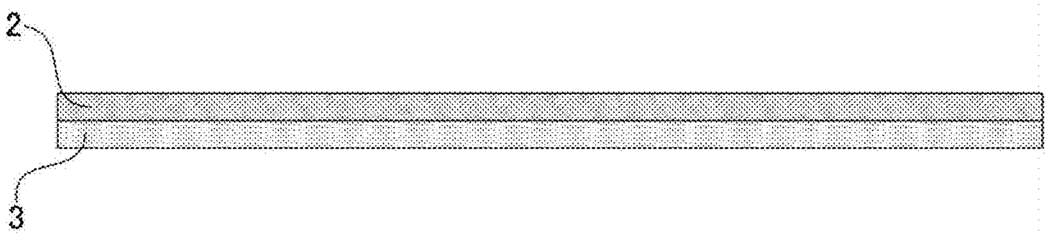
FIG. 6A is a schematic view illustrating an example of a method for producing a repairing component (part 1)
Figure 6B:
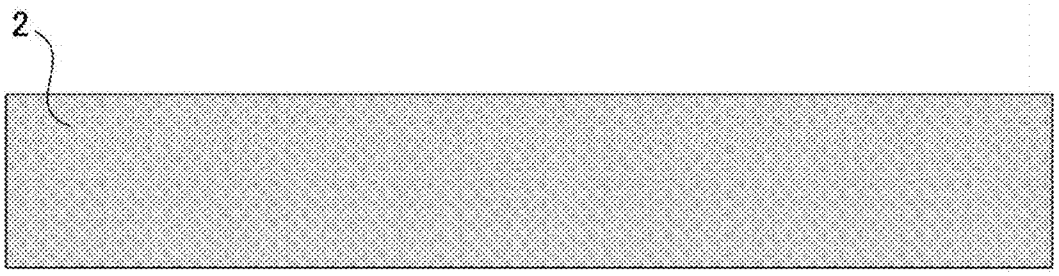
FIG. 6B is a schematic view illustrating the example of the method for producing a repairing component (part 2)

First, an anisotropic conductive film, in which an anisotropic conductive layer 2 is disposed on a base 3 in the form of tape, is prepared (FIGS. 6A and 6B). FIG. 6A is a schematic cross-sectional view illustrating an anisotropic conductive film. FIG. 6B is a schematic top view illustrating the anisotropic conductive film.

Figure 6C:
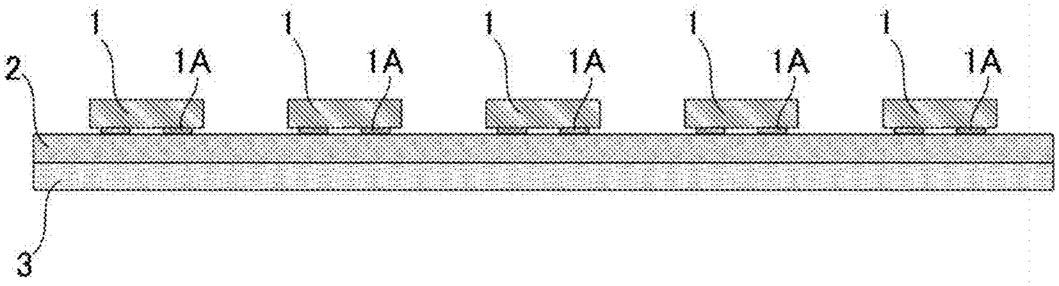
FIG. 6C is a schematic view illustrating the example of the method for producing a repairing component (part 3)
Figure 6D:
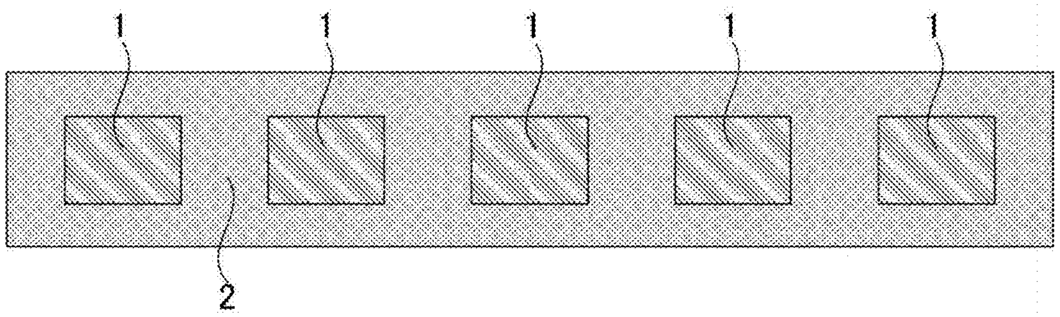
FIG. 6D is a schematic view illustrating the example of the method for producing a repairing component (part 4)

Next, a plurality of micro-LED chips 1 is arranged on the anisotropic conductive layer 2 in a manner that the micro-LED chips 1 are set apart from one another (FIGS. 6C and 6D). FIG. 6C is a schematic cross-sectional view. FIG. 6D is a schematic top view. Although the micro-LED chips are aligned into a single line along the longitudinal direction of the base in the form of tape in FIGS. 6C and 6D, the micro-LED chips may be aligned into multiple lines. The micro-LED chip 1 includes an electrode 1A. The micro-LED chip 1 is arranged on the anisotropic conductive layer 2 in a manner that the electrode 1A comes into contact with the anisotropic conductive layer 2.

Figure 6E:
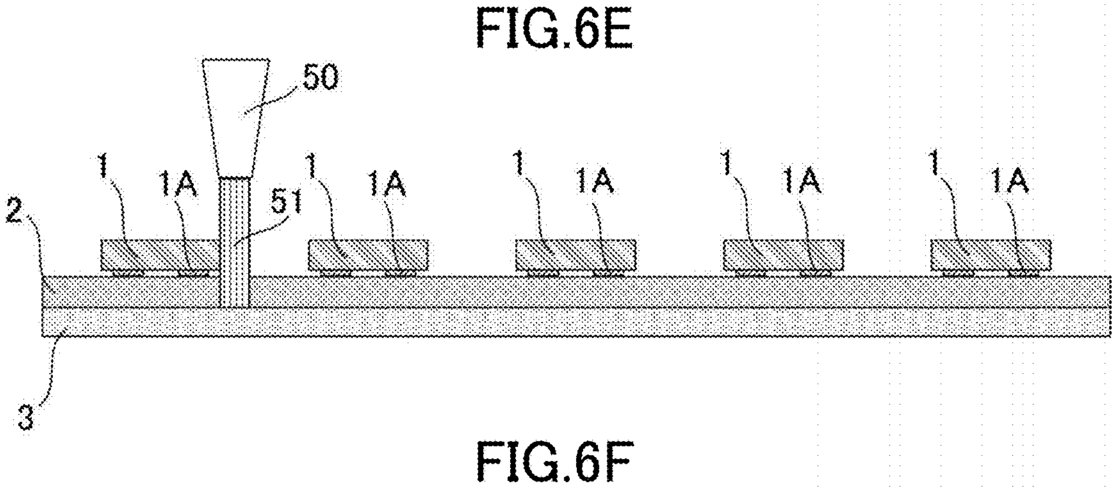
FIG. 6E is a schematic view illustrating the example of the method for producing a repairing component (part 5)
Figure 6F:
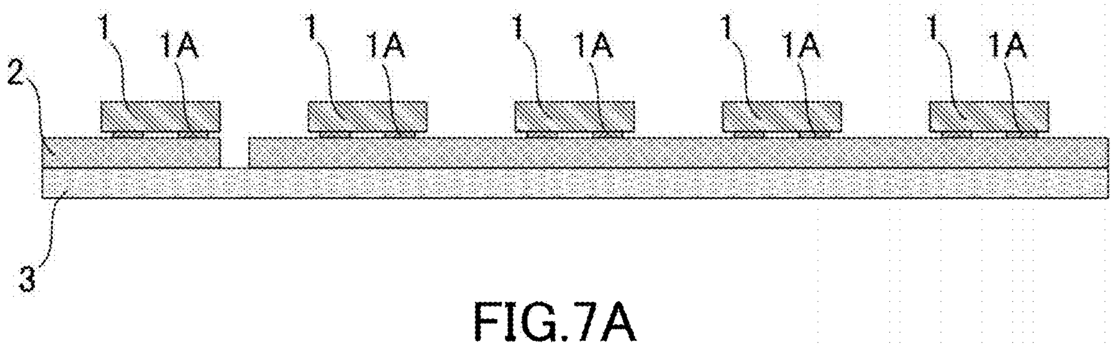
FIG. 6F is a schematic view illustrating the example of the method for producing a repairing component (part 6)

Next, laser 51 is applied from a laser irradiation source 50. The laser 51 is applied onto a portion of the anisotropic conductive layer 2 on the periphery of the plane (i.e., the electrode plane) of the micro-LED chip 1 facing the anisotropic conductive layer 2 (FIG. 6E). FIG. 6F illustrates a state where the portion of the anisotropic conductive layer 2 that is located at part of the periphery of the plane of the micro-LED chip 1 facing the anisotropic conductive layer 2 is removed. The same process is repeated to remove the portion of the anisotropic conductive layer 2 on the periphery of the plane of the micro-LED chip 1 facing the anisotropic conductive layer 2. As a result, the repairing component illustrated in FIGS. 5A and 5B is obtained.

Another example of the method for producing a repairing component will be described with reference to FIGS. 7A to 7I hereinafter.

Figure 7A:
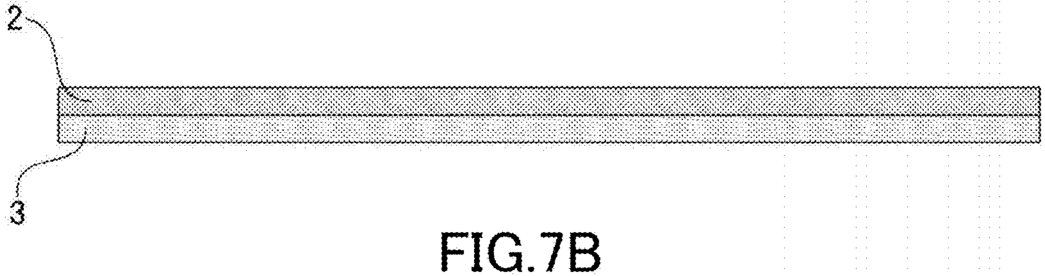
FIG. 7A is a schematic view illustrating another example of a method for producing a repairing component (part 1)
Figure 7B:
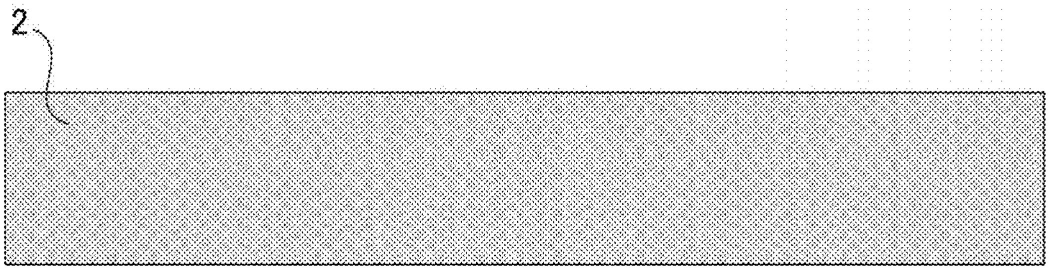
FIG. 7B is a schematic view illustrating another example of the method for producing a repairing component (part 2)

First, an anisotropic conductive film, in which an anisotropic conductive layer 2 is disposed on a base 3 in the form of tape, is prepared (FIGS. 7A and 7B). FIG. 7A is a schematic cross-sectional view illustrating an anisotropic conductive film. FIG. 7B is a schematic top view illustrating the anisotropic conductive film.

Figure 7C:
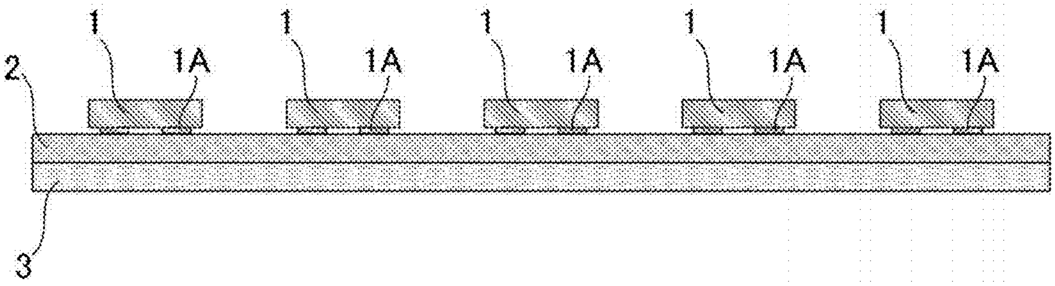
FIG. 7C is a schematic view illustrating another example of the method for producing a repairing component (part 3)
Figure 7D:
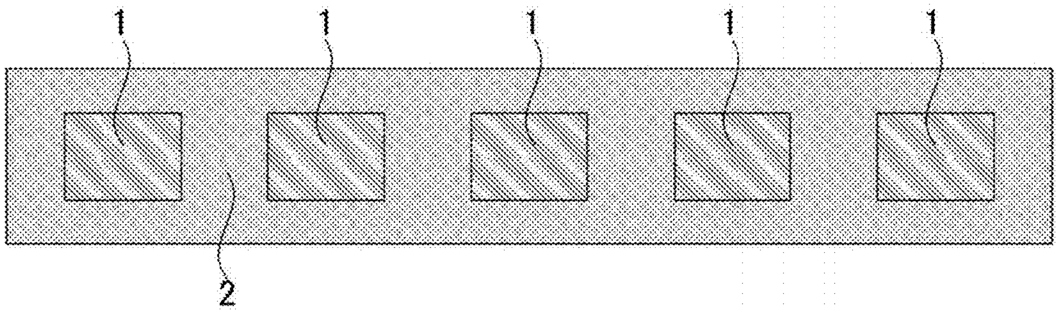
FIG. 7D is a schematic view illustrating another example of the method for producing a repairing component (part 4)

Next, a plurality of micro-LED chips 1 is arranged on the anisotropic conductive layer 2 in a manner that the micro-LED chips 1 are set apart from one another (FIGS. 7C and 7D). FIG. 7C is a schematic cross-sectional view. FIG. 7D is a schematic top view. Although the micro-LED chips are aligned into a single line along the longitudinal direction of the base in the form of tape in FIGS. 7C and 7D, the micro-LED chips may be aligned into multiple lines. The micro-LED chip 1 includes an electrode 1A. The micro-LED chip 1 is arranged on the anisotropic conductive layer 2 in a manner that the electrode 1A comes into contact with the anisotropic conductive layer 2.

Figure 7E:
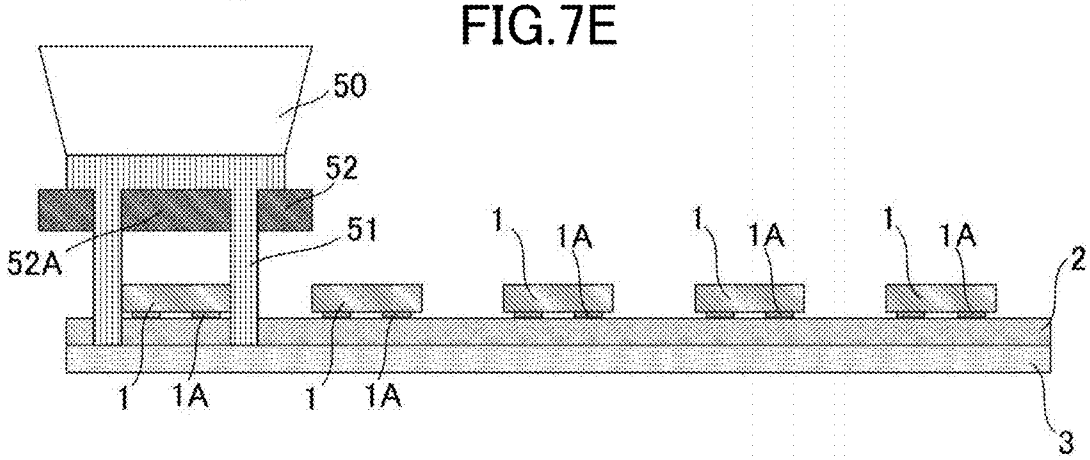
FIG. 7E is a schematic view illustrating another example of the method for producing a repairing component (part 5)
Figure 7F:
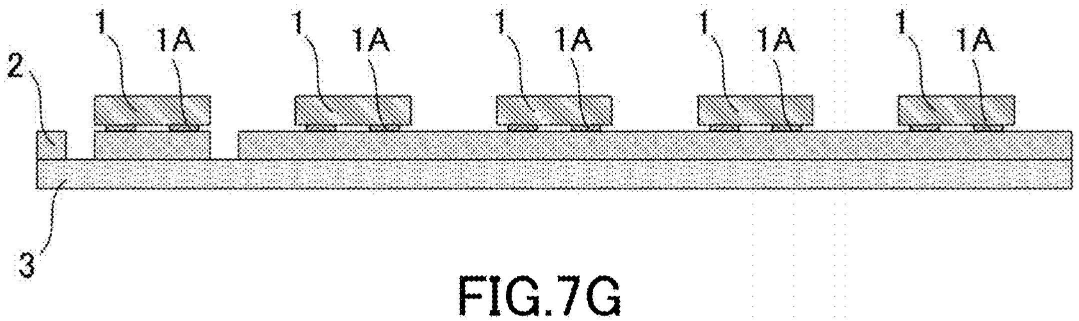
FIG. 7F is a schematic view illustrating another example of the method for producing a repairing component (part 6)
Figure 7G:
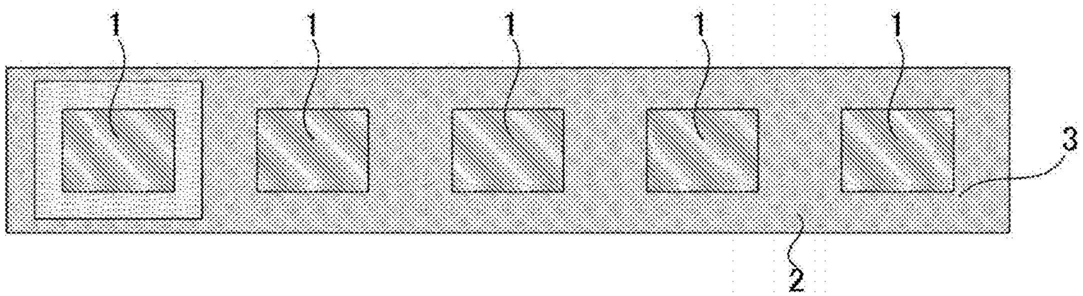
FIG. 7G is a schematic view illustrating another example of the method for producing a repairing component (part 7)
Figure 7H:
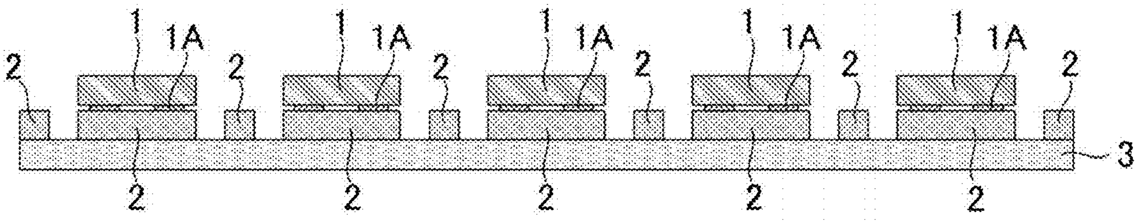
FIG. 7H is a schematic view illustrating another example of the method for producing a repairing component (part 8)
Figure 7I:
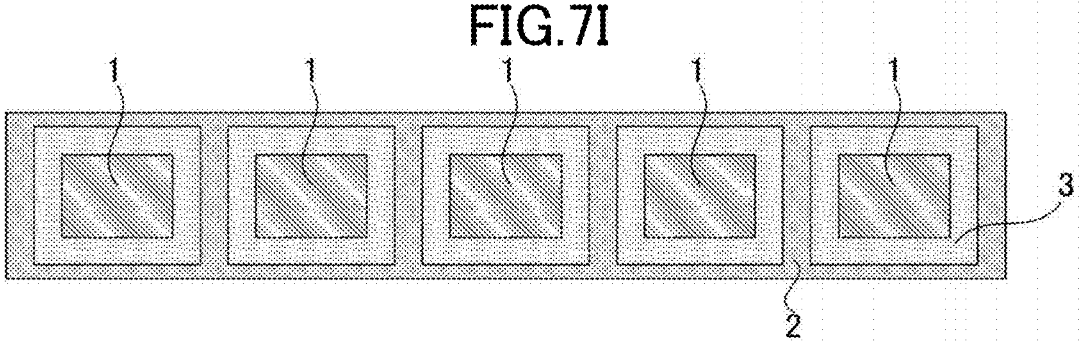
FIG. 7I is a schematic view illustrating another example of the method for producing a repairing component (part 9)

Next, laser 51 is applied from a laser irradiation source 50. The laser 51 is applied onto a portion of the anisotropic conductive layer 2 on the periphery of the plane (i.e., the electrode plane of the micro-LED chip 1 facing the anisotropic conductive layer 2 (FIG. 7E). Since the spot diameter of laser 51 is large relative to the anisotropic conductive layer 2 to be removed, laser 51 is applied to the anisotropic conductive layer 2 through a photomask 52. The photomask 52 has an opaque region 52A corresponding to a shape of the micro-LED chip 1 and an opening on the periphery of the opaque region 52A. Since laser is applied through the photomask 52, the portion of the anisotropic conductive layer 2 on the periphery of the plane (i.e., the electrode plane) of the micro-LED chip 1 facing the anisotropic conductive layer 2 is removed (FIG. 7F and FIG. 7G). The same process is repeated to remove the portion of the anisotropic conductive layer 2 on the periphery of the plane of the micro-LED chip 1 facing the anisotropic conductive layer 2. As a result, the repairing component illustrated in FIGS. 7H and 7I is obtained. FIG. 7H is a schematic cross-sectional view. FIG. 7I is a schematic top view.

(Repairing Method and Method for Producing Light Emitting Device)

The repairing method of the present invention includes a removing step and a mounting step, and may further include other steps, such as an inspection step and a heating and pressing step, according to the necessity.

The method for producing a light emitting device of the present invention includes a removing step and a mounting step, and may further include other steps, such as an inspection step and a heating and pressing step, according to the necessity.

For example, the repairing method may be performed during production of a light emitting device.

For example, the light emitting device can be applied to a display device (e.g., a micro-LED display), an illumination device (e.g., LED illumination), etc.

In the repairing method and the method for producing a light emitting device, an electrode of a micro-LED chip of a repairing component and an electrode of a wiring board are electrically connected through anisotropic electrical connection via an anisotropic conductive layer.

<Removing Step>

The removing step is not particularly limited, provided that the removing step is a step including removing a defective micro-LED chip from a light emitting panel. The removing step may be appropriately selected in accordance with the intended purpose.

A method for removing the defective micro-LED chip from the light emitting panel is not particularly limited, and may be appropriately selected in accordance with the intended purpose. Examples of the method include a method where the defective micro-LED chip is held by a jig and the defective micro-LED chip is pulled upwards with the jig.

<<Light Emitting Panel>>

The light emitting panel includes a wiring board, and a plurality of micro-LED chips.

The wiring board includes electrodes.

Each micro-LED chip includes an electrode and has an electrode plane on which the electrode is disposed.

In the light emitting panel, the electrode of the wiring board and the electrode of the micro-LED chip are electrically connected.

In the light emitting panel, the electrode of the wiring board and the electrode of the micro-LED chip are preferably electrically connected through anisotropic electrical connection via an anisotropic conductive layer.

—Wiring Board—

The wiring board is not particularly limited, provided that the wiring board includes a plurality of electrodes. The wiring board may be appropriately selected in accordance with the intended purpose.

A material, shape, size, and structure of the wiring board are not particularly limited, and may be appropriately selected in accordance with the intended purpose. Examples of the wiring board include a glass substrate, a glass epoxy substrate, and a polyimide film substrate.

A material, shape, size, and structure of the electrode on the wiring board are not particularly limited, and may be appropriately selected in accordance with the intended purpose.

—Micro-LED Chip—

The micro-LED chip includes an electrode and has an electrode plane on which the electrode is disposed.

Examples of the micro-LED chip include the micro-LED chip described in association with the repairing component of the present invention.

<Mounting Step>

The mounting step is not particularly limited, provided that the mounting step is a step including mounting a repairing component in a position of the light emitting panel from which the defective micro-LED chip is removed. The amounting step may be appropriately selected in accordance with the intended purpose. Examples of the mounting step include a method where the repairing component is mounted in a position, from which the defective micro-LED chip is removed, using a member capable of holding a micro-LED chip.

<<Repairing Component>>

The repairing component includes a micro-LED chip, and an anisotropic conductive layer. The repairing component may further include other components, such as a base, according to the necessity.

The micro-LED chip includes an electrode and has an electrode plane on which the electrode is disposed.

Examples of the micro-LED chip include the micro-LED chip described in association with the repairing component of the present invention.

In the repairing component, the anisotropic conductive layer is disposed to be in contact with the electrode disposed on the electrode plane of the micro-LED chip.

The anisotropic conductive layer in the repairing component has an area matching with the area of the electrode plane.

For example, the area of the anisotropic conductive layer is substantially identical to the area of the electrode plane. The substantially identical area of the anisotropic conductive layer means an area of the anisotropic conductive layer that hardly extends out from the electrode plane. For example, the substantially identical area is an area that is within ±10% relative to the area of the electrode plane.

Examples of the anisotropic conductive layer include the anisotropic conductive layer described in association with the repairing component of the present invention.

<Inspection Step>

The inspection step is not particularly limited, provided that the inspection step is a step including confirming whether any of the micro-LED chips disposed on the light emitting panel is a defective micro-LED chip. The inspection step may be appropriately selected in accordance with the intended purpose. Examples of the inspection step include a method where electricity is run through the micro-LED chips disposed on the light emitting panel to observe the light-emitting state of the micro-LED chips.

<Heating and Pressing Step>

The heating step is not particularly limited, provided that the heating step is a step including heating and pressing the repairing component after the mounting step. The heating step may be appropriately selected in accordance with the intended purpose. For example, the heating step is performed with a heat press member.

Examples of the heat press member include a press member including a heating system. Examples of the press member including a heating system include a heat tool.

In the repairing method and the method for producing a light emitting device, the electrode of the micro-LED of the repairing component and the electrode of the wiring board are electrically connected through anisotropic electrical connection via the cured anisotropic conductive layer. For example, the electrical connection through anisotropic electrical connection is established by performing the heating and pressing step. As the anisotropic conductive layer is heated and pressed, the electrode of the micro-LED chip and the electrode of the wiring board are electrically connected via the conductive particles included in the anisotropic conductive layer, and the micro-LED chip and the wiring board are bonded together because the anisotropic conductive layer is cured by heating.

A temperature for the heating is not particularly limited, and may be appropriately selected in accordance with the intended purpose. The temperature is preferably 150° C. or higher and 200° C. or lower.

Pressure for the pressing is not particularly limited, and may be appropriately selected in accordance with the intended purpose. The pressure is preferably 0.1 MPa or greater and 50 MPa or less.

Duration of the heating and pressing is not particularly limited, and may be appropriately selected in accordance with the intended purpose. For example, the duration is 0.5 seconds or longer and 120 seconds or shorter.

An example of the repairing method will be described with reference to FIGS. 8A to 8E hereinafter. The repairing method is also an example of the method for producing a light emitting device.

Figure 8A:
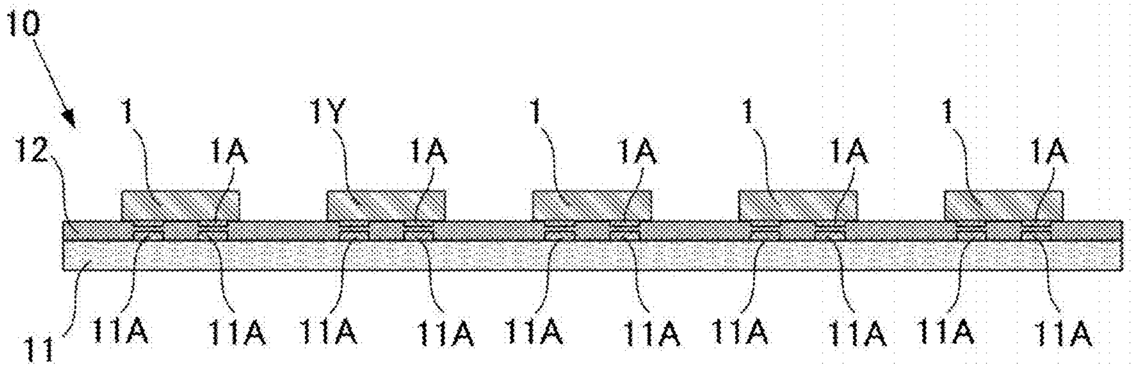
FIG. 8A is a schematic view illustrating an example of a repairing method (part 1)

FIG. 8A is a schematic cross-sectional view illustrating the light emitting panel 10.

The light emitting panel 10 includes a wiring board 11 and a plurality of micro-LED chips. The wiring board 11 includes a plurality of electrodes 11A. Each micro-LED chip includes an electrode and has an electrode plane on which the electrode 1A is disposed. Among five micro-LED chips of the light emitting panel 10 illustrated in FIG. 8A, one is a defective micro-LED chip 1Y. The electrodes 11A of the wiring board 11 and the electrodes 1A of the micro-LED chips 1 and 1Y are electrically connected through anisotropic electrical connection via the cured anisotropic conductive layer 12.

The micro-LED chips on the light emitting panel 10 are inspected whether there is any defective micro-LED chip.

Figure 8B:
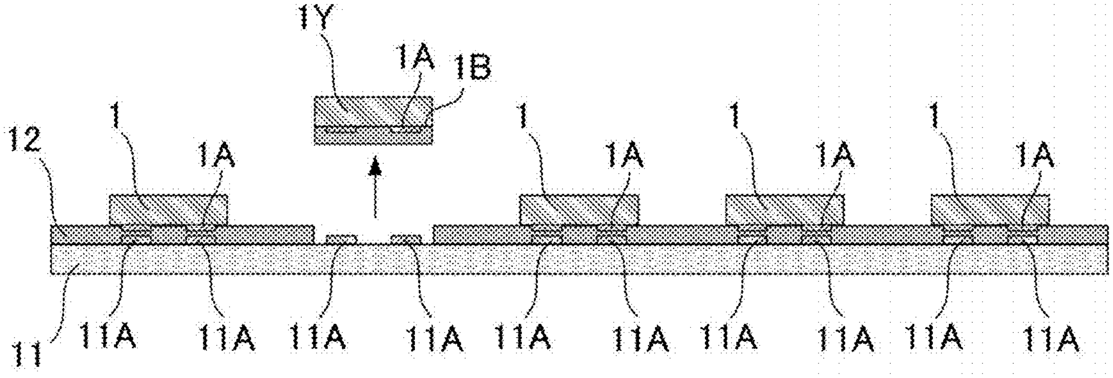
FIG. 8B is a schematic view illustrating the example of the repairing method (part 2)

The defective micro-LED chip 1Y detected by the inspection is removed from the light emitting panel 10, as illustrated in FIG. 8B. During removal of the defective micro-LED chip 1Y, the cured anisotropic conductive layer 12 in contact with the electrode plane 1B of the defective micro-LED chip 1Y is preferably removed together with the defective micro-LED chip 1Y. Laser is applied to the portion of the cured anisotropic conductive layer on the periphery of the defective micro-LED chip 1Y to remove the portion of the cured anisotropic conductive layer 12 on the periphery of the defective micro-LED chip 1Y by laser. As a result, the cured anisotropic conductive layer 12 in contact with the electrode plane 1B of the defective micro-LED chip 1Y can be easily removed from the light emitting panel 10 together with the defective micro-LED chip 1Y.

In a case where the cured anisotropic conductive layer 12 in contact with the electrode plane 1B of the defective micro-LED chip 1Y remains on the light emitting panel 10 after removing the defective micro-LED chip 1Y from the light emitting panel 10, the remained cured anisotropic conductive layer 12 is preferably removed from the light emitting panel 10. A method for removing the cured anisotropic conductive layer 12 is not particularly limited, and may be appropriately selected in accordance with the intended purpose. The cured anisotropic conductive layer 12 may be physically scraped off. Alternatively, laser may be applied to remove the cured anisotropic conductive layer 12.

Figure 8C:
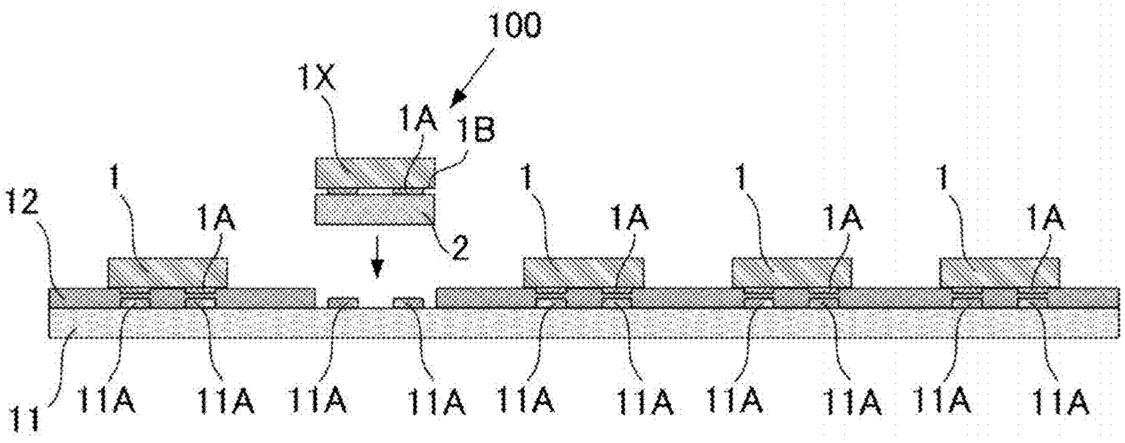
FIG. 8C is a schematic view illustrating the example of the repairing method (part 3)
Figure 8D:
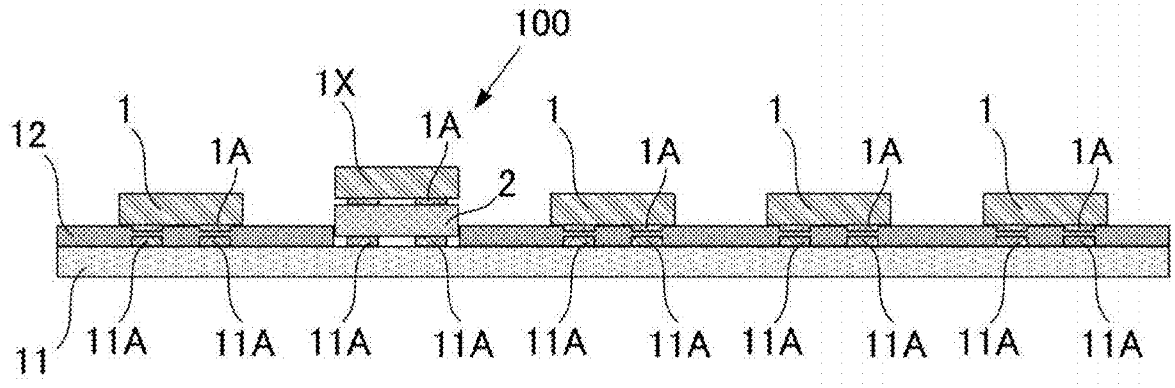
FIG. 8D is a schematic view illustrating the example of the repairing method (part 4)

Next, a repairing component 100 is mounted in the position of the light emitting panel 10 from which the defective micro-LED chip 1Y is removed, as illustrated in FIGS. 8C and 8D.

The repairing component 100 includes a micro-LED chip 1X and an anisotropic conductive layer 2. The micro-LED chip 1X has an electrode plane 1B on which an electrode 1A is disposed. The anisotropic conductive layer 2 is disposed to be in contact with the electrode 1A disposed on the electrode plane 1B of the micro-LED chip 1. The area of the anisotropic conductive layer 2 corresponds to the area of the electrode plane 1B.

For example, the repairing component 100 is the laminate X taken apart from the repairing component illustrated in FIGS. 5A and 5B.

Figure 8E:
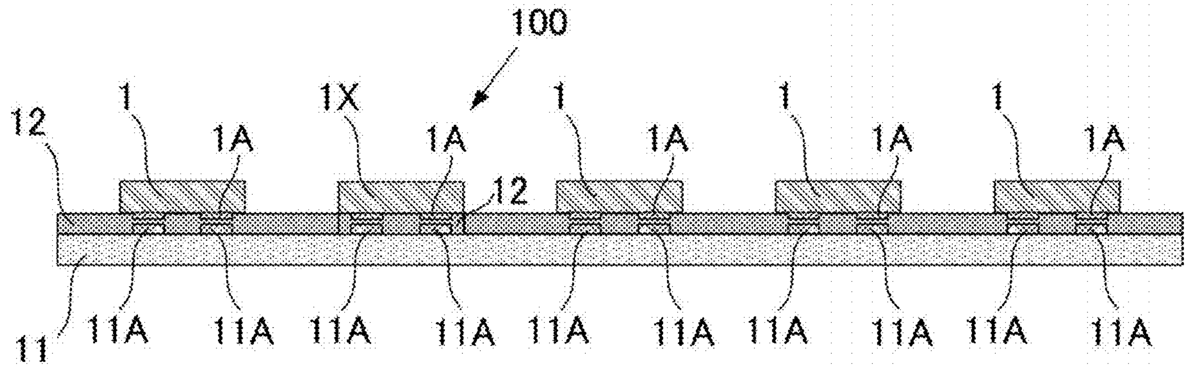
FIG. 8E is a schematic view illustrating the example of the repairing method (part 5).

Next, the repairing component 100 is heated and pressed. As result, the electrode 1A of the micro-LED chip 1X of the repairing component 100 and the electrode 11A of the wiring board 11 are electrically connected through anisotropic electrical connection via the cured anisotropic conductive layer 12, as illustrated in FIG. 8E.

As a result, the repair is completed.

(Light Emitting Device)

The light emitting device of the present invention includes a light emitting panel, and may further include other components according to the necessity.

The light emitting panel includes a wiring board, a plurality of micro-LED chips, an anisotropic conductive layer, and the repairing component of the present invention. The light emitting panel may further include other components according to the necessity.

The wiring board includes electrodes.

The micro-LED chip includes an electrode and has an electrode plane on which the electrode is disposed.

The anisotropic conductive layer electrically connects the electrode of the wiring board and the electrode of the micro-LED chip through anisotropic electrical connection. In other words, the electrode of the wiring board and the electrode of the micro-LED chip are electrically connected through anisotropic electrical connection via the anisotropic conductive layer.

The repairing component and the wiring board are electrically connected through anisotropic electrical connection via the anisotropic conductive layer of the repairing component.

The wiring board is not particularly limited, and may be appropriately selected in accordance with the intended purpose. Examples of the wiring board include the wiring board described in association with the repairing method and the method for producing a light emitting device according to the present invention.

The micro-LED chip is not particularly limited, and may be appropriately selected in accordance with the intended purpose. Examples of the micro-LED chip include the micro-LED chip described in association with the repairing component of the present invention.

A size, shape, material, and structure of the anisotropic conductive layer electrically connecting the electrode of the wiring board and the electrode of the micro-LED chip through anisotropic electrical connection are not particularly limited, and may be appropriately selected in accordance with the intended purpose. Examples of a material of the anisotropic conductive layer include the material of the anisotropic conductive layer described in association with the repairing component of the present invention.

EXAMPLES

Concrete examples of the present invention will be described hereinafter. The present invention shall not be restricted to the examples below.

(Members Used)

<Micro-LED Chip> micro-LED chip available from DEXERIALS CORPORATION

Size: 18 μm×40 μm

Electrode size: 15 μm×15 μm

<Anisotropic Conductive Film 1 (ACF 1)>

An anisotropic conductive film (PAF700 series, a particle-aligned anisotropic conductive film, available from DEXERIALS CORPORATION) in which an anisotropic conductive layer (average thickness: 8 μm) was formed on PET (polyethylene terephthalate: 20 mm×20 mm, average thickness: 50 μm).

<Anisotropic Conductive Film 2 (ACF 2)>

An anisotropic conductive film (a radical curable anisotropic conductive film, available from DEXERIALS CORPORATION) in which an anisotropic conductive layer (average thickness: 8 μm) was formed on PET (polyethylene terephthalate: 20 mm×20 mm, average thickness: 50 μm).

—Anisotropic Conductive Layer—

Main Constituent Components:

Acrylate compound

Film forming resin (phenoxy resin)

Peroxide-based curing agent

Conductive particles (normal particle dispersion type, average particle diameter: 3 μm)

<Anisotropic Conductive Film 3 (ACF 3)>

An anisotropic conductive film (a cationic curing anisotropic conductive film, available from DEXERIALS CORPORATION) in which an anisotropic conductive layer (average thickness: 8 μm) was formed on glass (30 mm×30 mm, average thickness: 1 mm).

—Anisotropic Conductive Layer—

Main Constituent Components:

Epoxy resin

Film forming resin (phenoxy resin)

Cation-based curing agent

Conductive particles (normal particle dispersion type, average particle diameter: 3 μm)

Example 1

A repairing component as illustrated in FIGS. 5A and 5B was produced using Anisotropic Conductive Film 1 and the above-described micro-LED chip in the same manner as the above-described method for producing a repairing component with reference to FIGS. 6A to 6F.

For laser irradiation, a device capable of performing pulsed-laser ablation was used. Conditions for the laser irradiation were as follows.

Laser Irradiation Conditions

Type of laser: YAG Laser

Laser wavelength: 266 nm

Laser energy intensity: 10%

Number of laser shots for irradiation: 1

The obtained repairing component was evaluated in the following manner. The results are presented in Table 1.

<Removal of ACF>

Whether the portion of the anisotropic conductive layer irradiated with laser was removed or not was confirmed by observing under a metallurgical microscope after the laser irradiation. The result was evaluated based on the following evaluation criteria.

[Evaluation Criteria]

A: The portion of the anisotropic conductive layer to be removed was completely removed.

B: The portion of the anisotropic conductive layer to be removed slightly remained.

C: The portion of the anisotropic conductive layer to be removed was not removed at all.

<Picking Up>

The laminate X was picked up from the obtained repairing component.

Specifically, the laminate X was picked up in the following manner. The upper plane of the micro-LED chip 1 of the laminate X in the repairing component illustrated in FIG. 5A was sucked by a suction nozzle. Then, the suction nozzle was moved upwards to pick the laminate X up from the base 3 (PET).

The above-described process of picking up was performed on 10 laminates X. The state during the process was observed under a metallurgical microscope, and the result was evaluated based on the following evaluation criteria.

[Evaluation Criteria]

A: All the 10 laminates X were picked up. Specifically, the anisotropic conductive layer 2 in contact with the micro-LED chip did not remain on base 3 in all the 10 laminates X.

B: The anisotropic conductive layer 2 in contact with the micro-LED chip 1 remained on the base 3 in the one to nine laminates X picked up.

C: In all the 10 laminates X picked up, only the micro-LED chip 1 was picked up and the anisotropic conductive layer 2 in contact with the micro-LED chip 1 remained on the base 3.

<Light Emission of LED>

As an evaluation wiring board, the following substrate was used. Substrate specifications: a glass substrate with ITO wirings, pattern/space=50 μm/8 μm A laminate X was picked up from the produced repairing component in the same manner as the method used in the evaluation for picking up, and the laminate X was mounted on the evaluation wiring board in a manner that the electrode 1A faced the electrode of the evaluation wiring board. Then, the laminate X was pressed against the evaluation wiring board by a bonding device under the following heating and pressing conditions to electrically connect through anisotropic electrical connection.

Heating and pressing conditions: 150° C., 10 sec, 10 MPa

Then, electric current was run through the evaluation wiring board to confirm light emission of LED with naked eyes.

The above-described operation was performed with 10 repairing components in total.

The results are evaluated based on the following evaluation criteria.

[Evaluation Criteria]

A: All the 10 LEDs emitted light.

B: One to nine LEDs emitted light.

C: All the 10 LEDs did not emit light.

Examples 2 to 8 and 10 to 11

Repairing components were each produced in the same manner as in Example 1, except that the type of the anisotropic conductive film, the laser wavelength, the laser energy intensity, and the number of laser shots for irradiation were changed to the anisotropic conductive film, the laser wavelength, the laser energy intensity, and the number of laser shots for irradiation presented in Tables 1 and 2, respectively.

The obtained repairing components are evaluated in the same manner as in Example 1. The results are presented in Tables 1 and 2.

Example 9

A repairing component as illustrated in FIGS. 5A and 5B was produced using Anisotropic Conductive Film 1 and the above-described micro-LED chip in the same manner as the above-described method for producing a repairing component with reference to FIGS. 7A to 7G.

For laser irradiation, a device capable of performing pulsed-laser ablation was used. Conditions for the laser irradiation were as follows.

Laser Irradiation Conditions

Type of laser: YAG Laser

Laser wavelength: 266 nm

Laser energy intensity: 10%

Number of laser shots for irradiation: 1

The obtained repairing component was evaluated in the same manner as in Example 1. The results are presented in Table 2.

Comparative Example 1

The above-described micro-LED chip was mounted on Anisotropic Conductive Film 1 to produce a repairing component. Specifically, the area of the anisotropic conductive layer did not correspond to the area of the electrode plane of the micro-LED chip in the repairing component of Comparative Example 1.

The obtained repairing component was evaluated in the following manner. The results are presented in Table 2.

<Picking Up>

The micro-LED chip was picked up from the obtained repairing component.

Specifically, the micro-LED chip was picked up in the following manner. The upper plane of the micro-LED chip of the repairing component was sucked by a suction nozzle. Then, the suction nozzle was moved upwards to pick the micro-LED chip up from the base (PET).

The above-described process of picking up was performed on 10 micro-LED chips. The state during the process was observed under a metallurgical microscope, and the result was evaluated based on the following evaluation criteria.

[Evaluation Criteria]

A: All the 10 micro-LED chips were picked up together with the anisotropic conductive layer. Specifically, the anisotropic conductive layer did not remain on base in all of the 10 micro-LED chips.

B: The anisotropic conductive layer remained on the base in the one to nine micro-LED chips picked up.

C: In all the 10 micro-LED chips picked up, only the micro-LED chip was picked up and the anisotropic conductive layer remained on the base.

<Light Emission of LED>

The evaluation result of picking up was "C." In other words, the picked up micro-LED chip could not be electrically connected to the evaluation wiring board used in Example 1 through anisotropic electrical connection because the anisotropic conductive layer was not attached to the picked up the micro-LED chip. Therefore, the LED lighting evaluation performed in Example 1 could not be performed.

TABLE 1

| | Ex. 1 | Ex. 2 | Ex. 3 | Ex. 4 | Ex. 5 | Ex. 6 |
|---|---|---|---|---|---|---|
| Laser wavelength | 266 nm | 266 nm | 266 nm | 266 nm | 266 nm | 266 nm |
| Laser energy intensity | 10% | 5% | 20% | 30% | 50% | 100% |
| Number of laser shots for irradiation | 1 | 1 | 1 | 1 | 1 | 1 |
| Application of laser | Per 1 side (FIG. 6E) | Per 1 side (FIG. 6E) | Per 1 side (FIG. 6E) | Per 1 side (FIG. 6E) | Per 1 side (FIG. 6E) | Per 1 side (FIG. 6E) |
| Type of ACF | ACF1 | ACF1 | ACF1 | ACF1 | ACF1 | ACF1 |
| Removal of ACF | A | B | A | A | A | A |
| Picking up | A | B | A | A | A | A |
| Light emission of LED | A | A | A | A | A | B |

TABLE 2

| | Ex. 7 | Ex. 8 | Ex. 9 | Ex. 10 | Ex. 11 | Comp. Ex. 1 |
|---|---|---|---|---|---|---|
| Laser wavelength | 266 nm | 266 nm | 266 nm | 266 nm | 355 nm | No laser irradiation |
| Laser energy intensity | 5% | 10% | 10% | 10% | 10% | |
| Number of laser shots for irradiation | 10 | 1 | 1 | 1 | 1 | |
| Application of laser | Per 1 side (FIG. 6E) | Per 1 side (FIG. 6E) | 4 sides at once (FIG. 7E) | Per 1 side (FIG. 6E) | Per 1 side (FIG. 6E) | |
| Type of ACF | ACF1 | ACF2 | ACF1 | ACF3 | ACF1 | ACF1 |
| Removal of ACF | A | A | A | A | A | — |
| Picking up | A | A | A | A | A | C |
| Light emission of LED | A | A | A | A | A | Unable to evaluate |

Excellent picking up was confirmed in Examples 1 to 11 in comparison with Comparative Example 1. In Examples 1, 3 to 5, and 7 to 11 where the total laser irradiation intensity from the laser irradiation was 1,000 mJ/cm$^2$ or greater and 5,000 mJ/cm$^2$ or less, the removal of ACF, picking up, and Light emission of LED were all excellent.

INDUSTRIAL APPLICABILITY

Since the repairing component of the present invention can easily replace a defective micro-LED chip, the repairing component of the present invention is suitably used for production of a display device.

REFERENCE SIGNS LIST

1: micro-LED chip
1Y: defective micro-LED chip
1A: electrode
1B: electrode plane
2: anisotropic conductive layer
2A: plane
3: base
10: light emitting panel
11: wiring board
11A: electrode
12: cured anisotropic conductive layer
50: laser irradiation source
51: laser
52: photomask
100: repairing component
X: laminate

The invention claimed is:

1. A repairing component comprising:

micro-LED chips, each of which including an electrode and having an electrode plane on which the electrode is disposed; and first anisotropic conductive layers, each of which being disposed to be in contact with the electrode disposed on the electrode plane of each of the micro-LED chips, where each of the first anisotropic conductive layers has an area matching with an area of a corresponding electrode plane of the micro-LED chips;

at least one second anisotropic conductive layer on which no light-emitting elements are disposed; and a base disposed to be in contact with each plane of the first anisotropic conductive layers, the each plane of the first anisotropic conductive layers being at an opposite side to each plane of the first anisotropic conductive layers where each of the micro-LED chips is disposed, wherein a plurality of laminates are disposed on the base in a manner that the plurality of laminates are set apart from one another, where each laminate of the plurality of laminates includes each of the micro-LED chips and each of the first anisotropic conductive layers, and the at least one second anisotropic conductive layer is disposed on the base.

2. The repairing component according to claim 1, wherein the base is polyethylene terephthalate or glass.

3. The repairing component according to claim 1, wherein the base is in the form of tape.

4. The repairing component according to claim 3, wherein the base is polyethylene terephthalate having an average thickness of 10 μm or greater and 100 μm or less, or glass having an average thickness of 0.05 mm or greater and 10 mm or less.

5. The repairing component according to claim 1, wherein the at least one second anisotropic conductive layer is located between adjacent laminates of the plurality of laminates and at an edge of the base.

6. The repairing component according to claim 1, wherein the base is polyethylene terephthalate or glass, and each of the first anisotropic conductive layers and the at least one second anisotropic conductive layer are in direct contact with a surface of the base.

* * * * *